United States Patent
Hayashi (10) Patent No.: US 10,095,261 B2
(45) Date of Patent: Oct. 9, 2018

(54) REMOTE OPERATION DEVICE

(71) Applicant: DENSO CORPORATION, Kariya, Aichi-pref. (JP)

(72) Inventor: Kazumi Hayashi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 233 days.

(21) Appl. No.: 15/119,590

(22) PCT Filed: Feb. 13, 2015

(86) PCT No.: PCT/JP2015/000661
§ 371 (c)(1),
(2) Date: Aug. 17, 2016

(87) PCT Pub. No.: WO2015/125445
PCT Pub. Date: Aug. 27, 2015

(65) Prior Publication Data
US 2017/0052557 A1 Feb. 23, 2017

(30) Foreign Application Priority Data
Feb. 21, 2014 (JP) .................... 2014-031711

(51) Int. Cl.
*G05G 9/047* (2006.01)
*B60K 37/06* (2006.01)
(Continued)

(52) U.S. Cl.
CPC ............ *G05G 9/047* (2013.01); *B60K 37/06* (2013.01); *H01H 25/065* (2013.01);
(Continued)

(58) Field of Classification Search
CPC ............ B60K 37/06; B60K 2350/102; G05G 2009/04766; G05G 9/047; G05G 1/08;
(Continued)

(56) References Cited

U.S. PATENT DOCUMENTS

2002/0196233 A1  12/2002  Kataoka et al.
2008/0197004 A1* 8/2008  Ishigaki ................. B60K 37/06
                                                              200/336
(Continued)

FOREIGN PATENT DOCUMENTS

JP          3638071 B2      4/2005
JP       2010044490 A       2/2010
(Continued)

*Primary Examiner* — Koosha Sharifi-Tafreshi
(74) *Attorney, Agent, or Firm* — Harness, Dickey & Pierce, P.L.C.

(57) ABSTRACT

A remote operation device includes a first operation acceptance portion having a rotary dial, a second operation acceptance portion provided along an outer periphery of the rotary dial and allowed to rotate separately from the rotary dial, and a control portion. When a relative position of a user's hand with respect to the first operation acceptance portion is at a covered position, the control portion switches the first operation acceptance portion and the second operation acceptance portion to a locked state and accepts an operation on the first operation acceptance portion. When the relative position of the user's hand with respect to the first operation acceptance portion is at an uncovered position, the control portion switches the first operation acceptance portion and the second operation acceptance portion to an unlocked state and accepts an operation on the second acceptance portion.

3 Claims, 6 Drawing Sheets

(51) Int. Cl.
*H01H 25/06* (2006.01)
*H03K 17/96* (2006.01)
*H01H 25/04* (2006.01)
*H01H 9/20* (2006.01)
*H01H 3/00* (2006.01)

(52) U.S. Cl.
CPC . *H03K 17/962* (2013.01); *G05G 2009/04766* (2013.01); *H01H 9/20* (2013.01); *H01H 25/04* (2013.01); *H01H 2003/008* (2013.01); *H01H 2217/034* (2013.01); *H01H 2221/052* (2013.01)

(58) Field of Classification Search
CPC ...... H01H 25/04; H01H 25/06; G06F 3/0362; G06F 1/169; G06F 3/033
USPC .............................. 345/156, 161, 163, 184
See application file for complete search history.

(56) References Cited

U.S. PATENT DOCUMENTS

| | | | |
|---|---|---|---|
| 2009/0273490 A1 | 11/2009 | Ishikawa et al. | |
| 2010/0045624 A1* | 2/2010 | Hisatsugu | B60H 1/00985 345/173 |
| 2013/0194214 A1* | 8/2013 | Minamitani | G06F 3/02 345/173 |

FOREIGN PATENT DOCUMENTS

| | | |
|---|---|---|
| JP | 2013098133 A | 5/2013 |
| JP | 2015156348 A | 8/2015 |

\* cited by examiner

UNLOCKED STATE

FIG. 6B

LOCKED STATE

REMOTE OPERATION DEVICE

CROSS REFERENCE TO RELATED APPLICATIONS

This application is a U.S. National Phase Application under 35 U.S.C. 371 of International Application No. PCT/JP2015/000661 filed on Feb. 13, 2015 and published in Japanese as WO 2015/125445 A1 on Aug. 27, 2015. This application is based on and claims the benefit of priority from Japanese Patent Application No. 2014-031711 filed on Feb. 21, 2014. The entire disclosures of all of the above applications are incorporated herein by reference.

TECHNICAL FIELD

The present disclosure relates to a remote operation device to operate a device installed to a mobile body by remote control.

BACKGROUND ART

A remote operation device in the related art enables a user to operate an in-vehicle device installed to an automobile by remote control without directly touching the in-vehicle device (see Patent Literature 1).

The remote operation device as above is attached to an attached portion, which is a predetermined portion of the automobile. The remote operation device as above includes an operation acceptance portion accepting an operation from an outside and a reactive force generation portion applying a force to the operation acceptance portion.

The operation acceptance portion has a rotary disc which is attached at a tip end of a tiltable and rotatable support shaft and therefore tilts and rotates integrally with the support shaft. The reactive force generation portion is a known mechanism that applies a force to the support shaft and the rotary disc with the purpose of enhancing tactile impression in the operation acceptance portion.

PRIOR ART LITERATURE

Patent Literature

Patent Literature 1: JP 2013-098133 A

SUMMARY OF INVENTION

For example, in a case where a user operates a car air conditioner as an in-vehicle device using the remote operation device in the related art, the user first selects and determines one controlled item among multiple controlled items predetermined in the car air conditioner by tilting the rotary disc (support shaft) of the operation acceptance portion. When the selection of the controlled item is completed, the user rotates the rotary disc with respect to the support shaft. An input of a control amount the user wishes to adjust is thus accepted.

It is, however, difficult to operate the in-vehicle device using the remote operation device in the related art because the user operates the operation acceptance portion against a force generated in the reactive force generation portion. The user may tilt the rotary disc (support shaft) of the operation acceptance portion too much or too little. In such a case, the user may possibly fail to select the controlled item the user originally intended to select. Hence, the remote operation device in the related art has a problem that the user rotates the rotary disc even when a different controlled item is selected contrary to the user's intention, and an input of a control amount of a different content is accepted instead of a control amount of the content that should have been inputted.

In other words, the remote operation device in the related art has a drawback that an input of a content different from a content of an operation the user originally intended to make is accepted by an erroneous operation.

The present disclosure has an object to provide a remote operation device that reduces acceptances of an input of a content different from a content of an operation the user originally intended to make due to an erroneous operation.

According to an aspect of the invention, a remote operation device is attached to an attached portion, which is a predetermined portion of a mobile body, and configured to operate a device installed to the mobile body by remote control.

The remote operation device includes a first operation acceptance portion, a second operation acceptance portion, a position detection portion, and a control portion.

The first operation acceptance portion is a mechanism to accept an operation from an outside and has a rotary disc supported in a displaceable and rotatable manner and a reactive force generation mechanism applying a force to the rotary disc in response to the operation from the outside. The second operation acceptance portion is a mechanism to accept an operation from the outside and provided along an outer periphery of the rotary disc of the first operation acceptance portion and allowed to rotate separately from at least the rotary disc.

The position detection portion detects a relative position of a user's hand with respect to the first operation acceptance portion. The control portion controls the first operation acceptance portion to be a subject to accept an operation when the relative position detected by the position detection portion is at a covered position and controls the second operation acceptance portion to be a subject to accept an operation when the relative position is at an uncovered position.

The term, "covered position", referred to herein is a relative position of the user's hand with respect to the first operation acceptance portion at which a percentage of the first operation acceptance portion covered by the user's hand is equal to or greater than a preliminarily determined percentage. The term, "uncovered position", referred to herein is a relative position of the user's hand with respect to the first operation acceptance portion at which a percentage of the first operation acceptance portion covered by the user's hand is less than the predetermined percentage.

According to the remote operation device configured as above, subjects to accept an operation (that is, subjects to accept an input) can be switched according to the relative position of the user's hand with respect to the first operation acceptance portion.

When the installed device is operated by remote control by the remote operation device configured as above, the user of the remote operation device first selects and determines a controlled item of the installed device to which a control amount the user wishes to adjust is to be inputted. The user selects the controlled item via the first operation acceptance portion by locating a relative position of the user's hand with respect to the first operation acceptance portion at a covered position. After the selection of the controlled item in the installed device is completed, the user of the remote operation device relocates the relative position of the user's hand with respect to the first operation acceptance portion at an uncovered position and inputs a control amount the user would like to adjust via the second operation acceptance portion.

In other words, according to the remote operation device configured as above, when the user inputs information via the first operation acceptance portion, a relative position of the user's hand with respect to the first operation acceptance portion has to be at a covered position. Meanwhile, when the user inputs information via the second operation acceptance portion, a relative position of the user's hand with respect to the first operation acceptance portion has to be at an uncovered position.

Consequently, according to the remote operation device of the present disclosure, acceptances of an input of a content different from a content of an operation the user originally intended to make due to an erroneous operation can be reduced.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
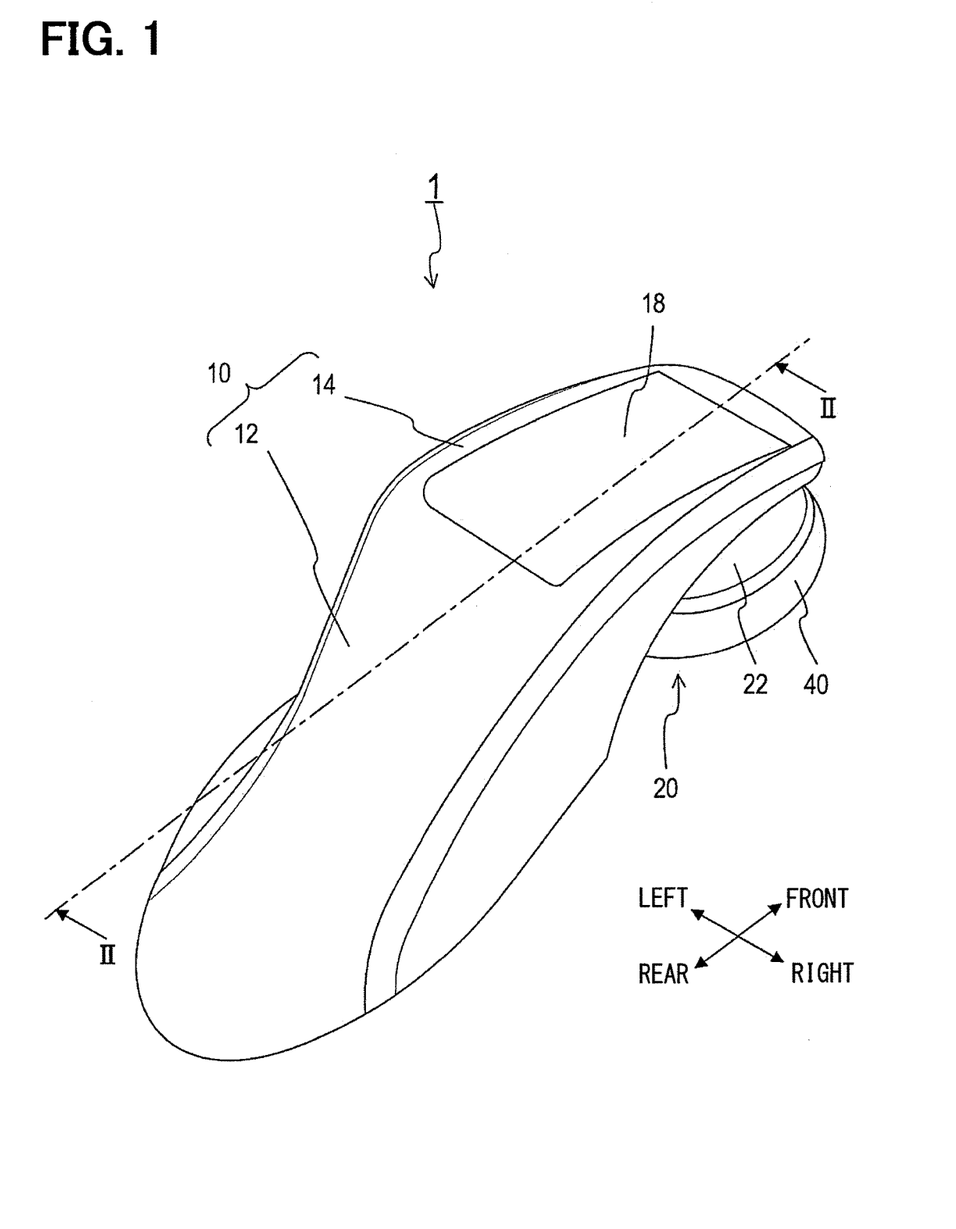
FIG. 1 is a perspective view showing an outer appearance of a remote operation device according to one embodiment of the present disclosure.

Hereinafter, embodiments of the present disclosure will be described with reference to the drawings.
Remote Operation Device A remote operation device 1 shown in FIG. 1 is a device to enable a user to operate an in-vehicle device 90 (see FIG. 4) installed to an automobile by remote control without directly touching the in-vehicle device 90. The in-vehicle device 90 referred to herein is an example and includes various types of devices installed to an automobile. The in-vehicle device 90 can be, for example, an in-vehicle navigation system (so-called car navigation system) that guides the user along a route to a destination, an air conditioner (in-vehicle air conditioner) that adjusts a temperature in a vehicle interior, and an audio instrument.

The remote operation device 1 is attached to a predetermined portion (hereinafter, referred to as an attached portion) 95 (see FIG. 2) of the automobile. For example, the attached portion 95 of the present embodiment is on top of a console provided between a driver's seat and a front passenger's seat in the vehicle interior.

Figure 4:
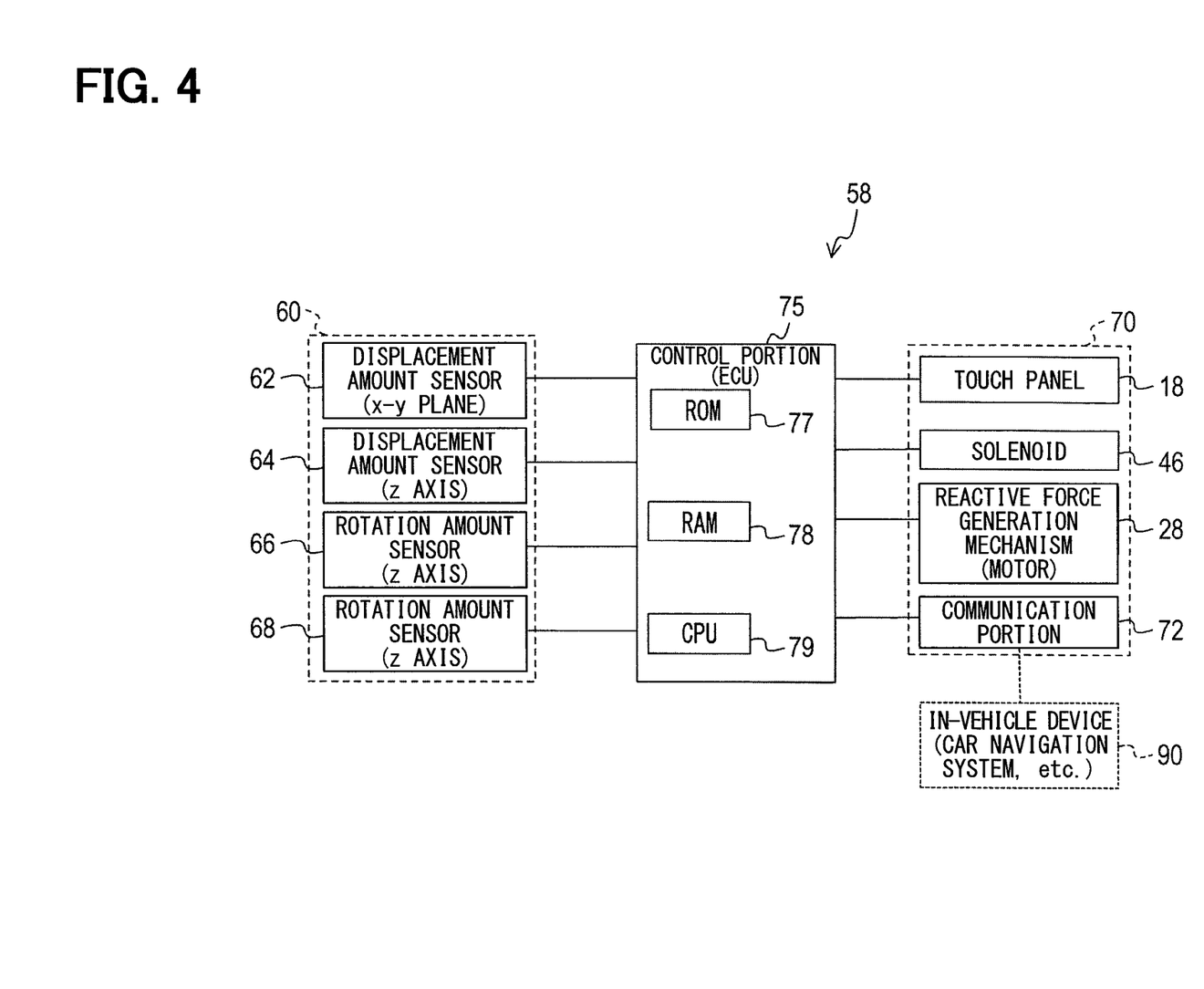
FIG. 4 is a block diagram of a control system of the remote operation device.

The remote operation device 1 includes a palm rest 10, an input mechanism 20, and a control system 58 (see FIG. 4).

The palm rest 10 is a portion on which the user rests his hand. The input mechanism 20 accepts inputs of various types of information necessary to control the in-vehicle device 90. The control system 58 outputs various types of information inputted via the input mechanism 20 to the in-vehicle device 90 and operates the in-vehicle device 90 by remote control.

The palm rest 10 is a tongue-like member extended from the attached portion 95, and includes an upward extending portion 12 and a forward extending portion 14. In the palm rest 10 of the present embodiment, the upward extending portion 12 and the forward extending portion 14 are provided as an integral unit.

The upward extending portion 12 is a pillar-like portion protruding upward in a vehicle height direction from the attached portion 95. The forward extending portion 14 is a plate-like portion extending forward along a full-length direction of the automobile from an end of the upward extending portion 12 on an opposite side to the attached portion 95. The forward extending portion 14 extends substantially parallel to an attached surface 97 of the attached portion 95. An open space is thus formed between the forward extending portion 14 and the attached surface 97 of the attached portion 95.

Figure 2:
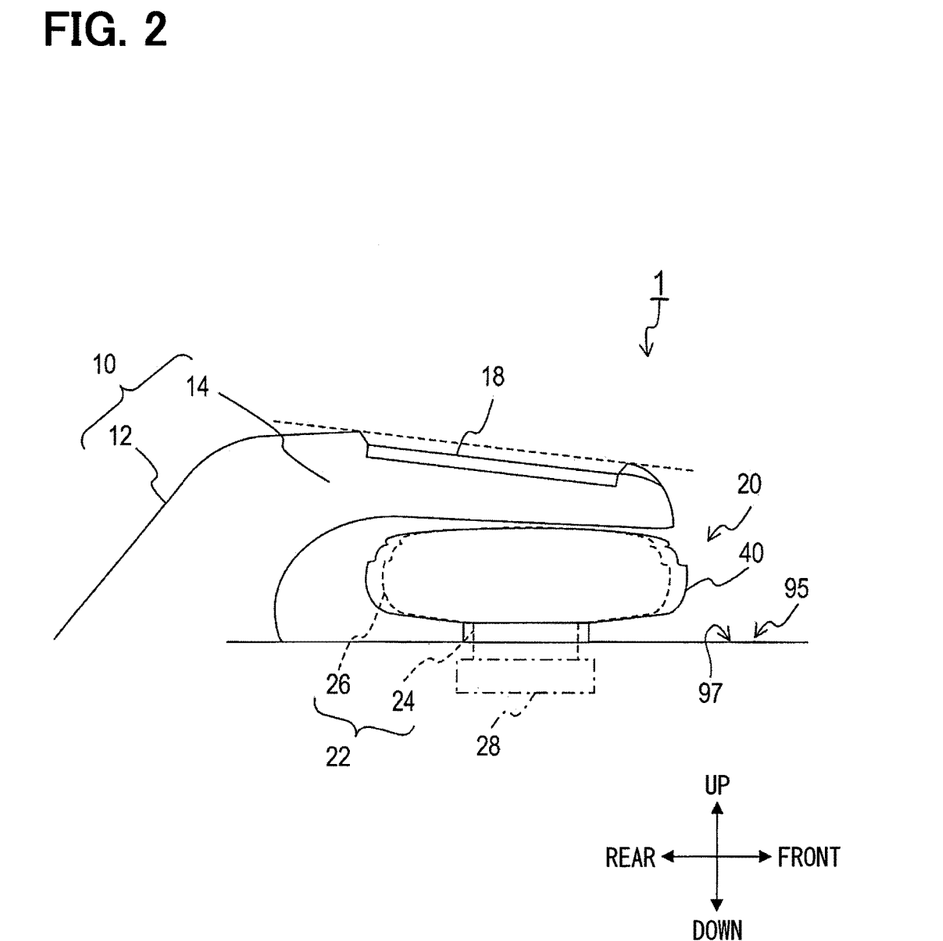
FIG. 2 is a sectional view taken along the line II-II of FIG. 1.

A touch panel 18 is provided on a top surface of the palm rest 10. The touch panel 18 is a known capacitance touch panel and configured to detect a position the user is touching with his finger and an area of the touch panel covered by the user's hand.
Input Mechanism The input mechanism 20 is a known mechanism to accept an input from the outside and, as is shown in FIG. 2, disposed in the open space formed between the forward extending portion 14 of the palm rest 10 and the attached surface 97 of the attached portion 95. The input mechanism 20 includes a first operation acceptance portion 22 and a second operation acceptance portion 40.

The first operation acceptance portion 22 has a support shaft 24 and a rotary dial 26.

The support shaft 24 is a shaft protruding from inside the remote operation device 1 and allowed to tilt in at least eight directions with respect to one end as a base point. The eight directions are front, rear, left, and right directions and respective midway directions. The rotary dial 26 is a rotary disc which is attached to the support shaft 24 at an end opposite to the one end as the base point of tilting and therefore tilts and rotates integrally with the support shaft 24. The rotary dial 26 of the first operation acceptance portion 22 of the present embodiment is allowed to rotate within a predetermined angle range (for example, from −15 degrees to +15 degrees) with respect to a reference axis preliminarily determined along the full-length direction of the automobile.

In other words, the first operation acceptance portion 22 is an operation lever to accept displacement from a neutral position preliminarily determined in the attached portion 95 as an input from the outside. The phrase, "displacement from the neutral position", referred to herein includes displacement due to tilting, displacement due to pressing, and displacement due to a rotation about an axis.

The phase, "displacement due to tilting", referred to herein is a direction in which the first operation acceptance portion 22 is tilted and a tilt amount in the attached surface 97 (that is, an x-y plane) of the attached portion 95. The tilt direction referred to herein includes at least eight directions: the full-length direction (front and rear directions) of the automobile and the vehicle width direction (left and right directions) of the automobile from the neutral position, and respective midway directions. The tilt amount includes an amount of displacement (angle of tilt) from the neutral position in the x-y plane.

The phrase, "displacement due to pressing", referred to herein is downward displacement along the vehicle height direction of the automobile (that is, a z axis). The phrase, "displacement due to a rotation about the axis", referred to herein is a rotation angle produced when the rotary dial 26 rotates about an axis (that is, the support shaft 24 (z axis)) along the vehicle height direction of the automobile as a center of rotation.

The first operation acceptance portion 22 is of a known configuration as described in, for example, JP 2013-98133 A, the disclosure of which is incorporated herein by reference. A detailed description of the configuration is therefore omitted herein.

The remote operation device 1 further includes a reactive force generation mechanism 28 that applies a force to the support shaft 24 and the rotary dial 26 with the purpose of enhancing tactile impression in the first operation acceptance portion 22.

The reactive force generation mechanism 28 chiefly includes an electric motor drive (that is, a motor) that converts electric energy to rotation energy and a gear that transmits a torque generated in the electric motor drive to the support shaft 24. The reactive force generation mechanism 28 of the present embodiment is configured to generate a force in an opposite direction to a rotation direction of the rotary dial 26 of the first operation acceptance portion 22 and a force in an opposite direction to a tilt direction of the first operation acceptance portion 22.

The reactive force generating mechanism 28 of the present embodiment is of a known configuration as described in, for example, JP 2010-44490 A, the disclosure of which is incorporated herein by reference. A detailed description of the configuration is therefore omitted herein.

Second Operation Acceptance Portion

Figure 3A:
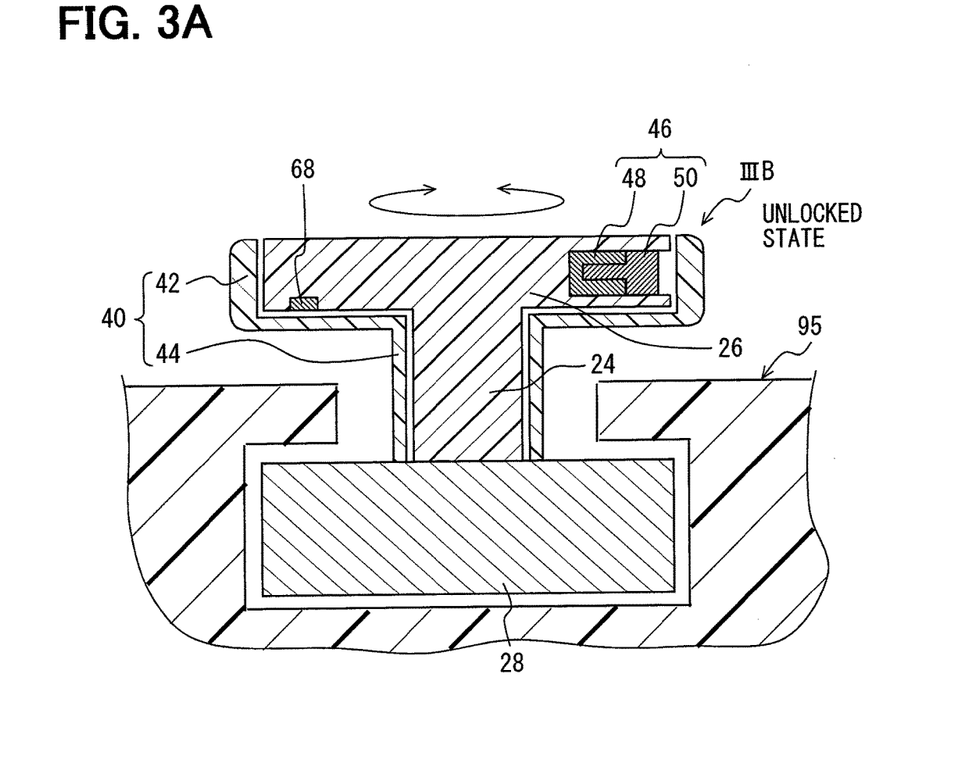
FIG. 3A is a schematic sectional view of a second operation acceptance portion of the remote operation device to show a configuration in an unlocked state.
Figure 3B:
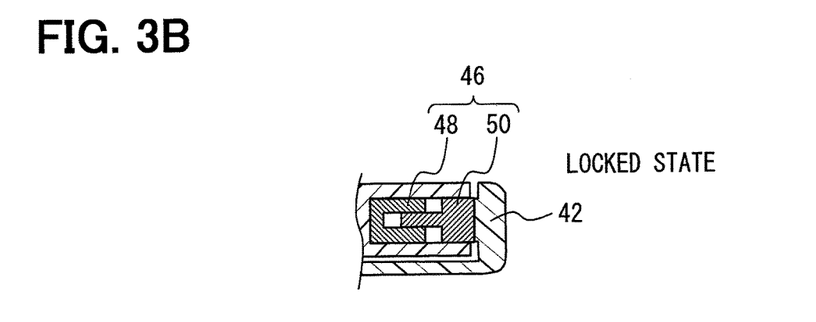
FIG. 3B is a partial sectional view of a portion IIIB of the second operation acceptance portion shown in FIG. 3A to show a locked state.

The second operation acceptance portion 40 is a mechanism to accept a rotation operation as an input from the outside and, as is shown in FIG. 3A and FIG. 3B, chiefly includes a member provided along an outer periphery of the rotary dial 26 of the first operation acceptance portion 22.

The second operation acceptance portion 40 includes a ring portion 42 and a shaft portion 44. The ring portion 42 and the shaft portion 44 are provided as an integral unit. The second operation acceptance portion 40 further includes a solenoid 46 and a rotation amount sensor 68.

The ring portion 42 is a member covering a side surface (that is, the outer periphery) of the rotary dial 26 of the first operation acceptance portion 22 and a part of a bottom surface of the rotary dial 26. The ring portion 42 is disposed so as to have a gap from the first operation acceptance portion 22 and is therefore out of contact with the first operation acceptance portion 22. The shaft portion 44 is a member covering an outer periphery of the support shaft 24 of the first operation acceptance portion 22. The shaft portion 44 is disposed so as to have a gap from the first operation acceptance portion 22 and the reactive force generation mechanism 28 and is therefore out of contact with the first operation acceptance portion 22 and the reactive force generation mechanism 28.

The solenoid 46 is a known actuator including a coil 48 and a movable iron core 50. The movable iron core 50 of the solenoid 46 is switched between a locked state in which the second operation acceptance portion 40 is locked with the first operation acceptance portion 22 so as to rotate integrally with the first operation acceptance portion 22 and an unlocked state in which the second operation acceptance portion 40 is released from the locked state so as to rotate separately from the first operation acceptance portion 22.

More specifically, the solenoid 46 is fixed in an inner part of the rotary dial 26 of the first operation acceptance portion 22 for the movable iron core 50 to be driven along a radial direction of the rotary dial 26.

In other words, as is shown in FIG. 3B, the solenoid 46 is switched to the locked state when the movable iron core 50 protrudes radially from the rotary dial 26 until the movable iron core 50 engages with an inner wall of the second operation acceptance portion 40. On the other hand, as is shown in FIG. 3A, the solenoid 46 remains in the unlocked state while the movable iron core 50 is positioned inside the coil 48.

The rotation amount sensor 68 is a sensor detecting a rotation angle of the second rotation acceptance portion 40 when the first operation acceptance portion 22 and the second operation acceptance portion 40 are in the unlocked state, that is, when the second operation acceptance portion 40 rotates independently. The rotation amount sensor 68 is, for example, a Hall IC.

The second operation acceptance portion 40 of the present embodiment is allowed to rotate within a predetermined angle range (for example, from −15 degrees to +15 degrees) with respect to a reference axis preliminarily determined along the full-length direction of the automobile.

Control System

The control system 58 of the remote operation device 1 will now be described.

As is shown in FIG. 4, the control system 58 includes a sensor group 60, a controlled subject group 70, and a control portion 75.

The sensor group 60 includes a displacement amount sensor 62, another displacement amount sensor 64, a rotation amount sensor 66, and the rotation amount sensor 68.

The displacement amount sensor 62 measures a tilt direction and a tilt amount (that is, displacement due to tilting) of the first operation acceptance portion 22. The displacement amount sensor 64 measures displacement of the first operation acceptance portion 22 due to pressing. The rotation amount sensor 66 detects a rotation angle (that is, displacement due to a rotation about the axis) of the rotary dial 26 of the first operation acceptance portion 22.

The controlled subject group 70 includes the touch panel 18, the solenoid 46, the reactive force generation mechanism 28, and a communication portion 72. The communication portion 72 controls information communications with each in-vehicle device 90 via an in-vehicle network.

The control portion 75 is an electronic control unit (so-called ECU) chiefly including a known computer having at least a ROM 77, a RAM 78, and a CPU 79. The ROM 77 stores processing programs and data, memory contents of which need to be stored even in the event of power shutdown. The RAM 78 temporarily stores processing programs and data. The CPU 79 performs various types of processing according to the processing programs stored in the ROM 77 and the RAM 78.

The ROM 77 stores processing programs for the control portion 75 to perform input acceptance processing, according to which the control portion 75 accepts inputs of information via the input mechanism 20 and operates a specified in-vehicle device 90 by remote control by outputting the accepted information to the specified in-vehicle device 90.

Input Acceptance Processing

The input acceptance processing performed by the control portion 75 will now be described.

The input acceptance processing is started when an ignition switch is turned ON. Once the input acceptance processing is started, the input acceptance processing is continued by the control portion 75 until the ignition switch is turned OFF.

Figure 5:
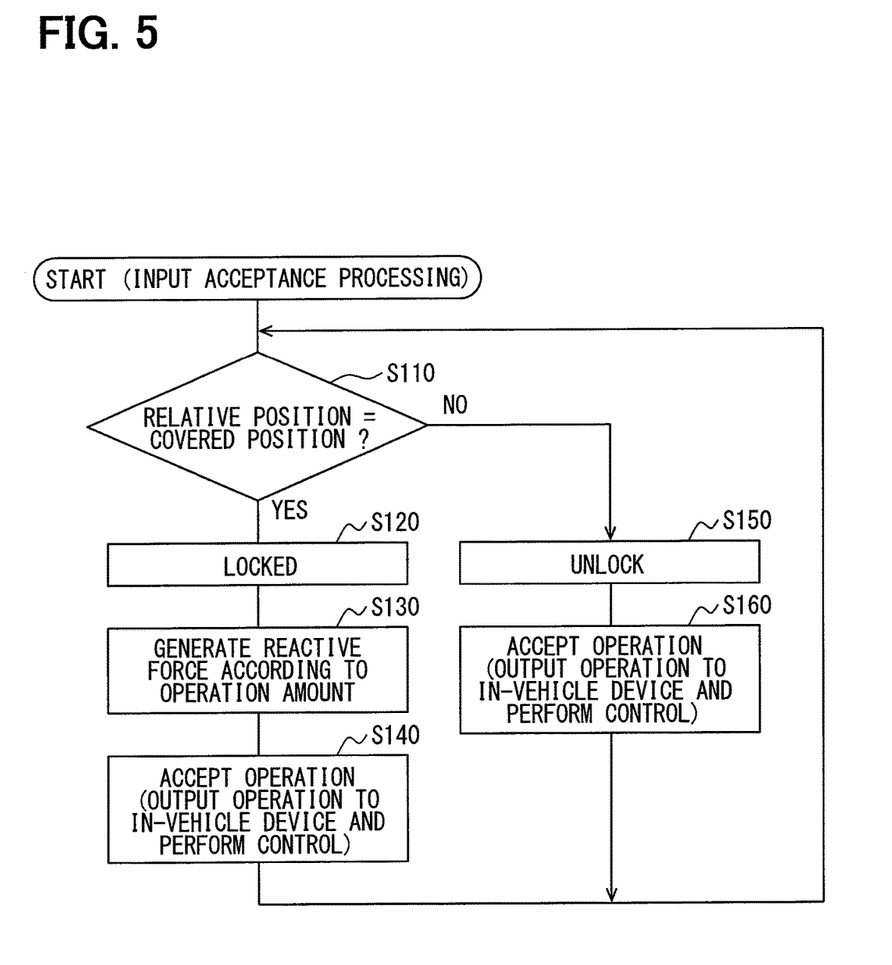
FIG. 5 is a flowchart depicting a processing procedure of input acceptance processing performed by a control portion of the remote operation device.

As is shown in FIG. 5, when the input acceptance processing is started, the control portion 75 first determines whether a relative position of the user's hand with respect to the first operation acceptance portion 22 is at a covered position or an uncovered position (S110). The term, "covered position", referred to herein is a relative position of the user's hand with respect to the first operation acceptance portion 22 at which a percentage of the first operation acceptance portion 22 covered by the user's hand is equal to or greater than a preliminarily determined percentage (for example, 50%). The term, "uncovered position", referred to herein is a relative position of the user's hand with respect to the first operation acceptance portion 22 at which a percentage of the first operation acceptance portion 22 covered by the user's hand is less than the predetermined percentage.

More specifically, when an area of the touch panel 18 in contact with the user's hand accounts for the predetermined percentage or more, the control portion 75 determines that the relative position of the user's hand with respect to the first operation acceptance portion 22 is at a covered position in S110 of the present embodiment. On the other hand, when an area of the touch panel 18 in contact with the user's hand accounts for less than the predetermined percentage, the control portion 75 determines that a relative position of the user's hand with respect to the first operation acceptance portion 22 is at an uncovered position in S110 of the present embodiment.

In the input acceptance processing, when the relative position of the user's hand with respect to the first operation acceptance portion 22 is at a covered position on the basis of a determination result in S110 (S110: YES), the control portion 75 drives the movable iron core 50 of the solenoid 46 to switch to the locked state (S120). In other words, the control portion 75 controls the solenoid 46 to lock the second operation acceptance portion 40 with the first operation acceptance portion 22 in S120 for the first operation acceptance portion 22 and the second operation acceptance portion 40 to operate integrally.

Further, the control portion 75 controls the reactive force generation mechanism 28 to generate a reactive force according to an amount of an operation on the first operation acceptance portion 22 (S130). In other words, in S130 of the present embodiment, the control portion 75 controls a current flowing to the motor forming the reactive force generation mechanism 28 for the reactive force generation mechanism 28 to generate a reactive force determined according to a detection result of the displacement amount sensor 62 or the rotation amount sensor 66.

In the input acceptance processing, the control portion 75 subsequently accepts an operation on the first operation acceptance portion 22 and sends information corresponding to the accepted operation to the in-vehicle device 90 via the communication portion 72 (S140). In other words, in S140 of the present embodiment, the control portion 75 outputs detection results of the displacement amount sensor 62, the displacement amount sensor 64, and the rotation amount sensor 66, more specifically, "displacement due to tilting (that is, a direction in which the first operation acceptance portion 22 is tilted and a tilt amount)", "displacement due to pressing (that is, downward displacement along the vehicle height direction of the automobile)", and "displacement due to a rotation about the axis (that is, a rotation angle of the rotary dial 26 about the z axis as the center of rotation)", to the in-vehicle device 90 via the communication portion 72. Upon acceptance of a content of the operation on the rotary dial 26 of the first operation acceptance portion 22, the in-vehicle device 90 performs a control corresponding to the content of the operation.

The phrase, "a control corresponding to the content of the operation in the in-vehicle device 90", referred to herein includes a change of the in-vehicle device 90 to be operated by remote control. The phrase, "a control corresponding to the content of the operation in the in-vehicle device 90", referred to herein also includes a change of a controlled item among multiple controlled items preliminarily determined in each in-vehicle device 90, and a change of settings in each controlled item in each in-vehicle device 90.

When the in-vehicle device 90 is, for example, an in-vehicle air conditioner, the term, "controlled item(s)", referred to herein includes switching of vents and setting of a temperature in the vehicle interior. When the in-vehicle device 90 is, for example, an in-vehicle navigation system, the term, "controlled item(s)", referred to herein includes a setting of a destination, scrolling of a map, and zooming in of a map.

In the input acceptance processing, the control portion 75 subsequently returns the processing to S110.

When the relative position of the user's hand with respect to the first operation acceptance portion 22 is at an uncovered position on the basis of a determination result in S110 (S110: NO), the control portion 75 drives the movable iron core 50 of the solenoid 46 to switch to the unlocked state (S150). In other words, in S150, the control portion 75 releases the second operation acceptance portion 40 locked with the first operation acceptance portion 22 by the solenoid 46 for the second operation acceptance portion 40 to rotate separately from the first operation acceptance portion 22.

In the input acceptance processing, the control portion 75 subsequently accepts an operation on the second operation acceptance portion 40 and sends information corresponding to the accepted operation to the in-vehicle device 90 from the communication portion 72 (S160). In other words, in S160 of the present embodiment, the control portion 75 outputs a detection result of the rotation amount sensor 68, more specifically, "a rotation operation on the second operation acceptance portion 40 (that is, a rotation angle of the second operation acceptance portion 40 about the z axis as the center of rotation)", to the in-vehicle device 90 via the communication portion 72. Upon acceptance of a content of the operation on the second operation acceptance portion 40, the in-vehicle device 90 adjusts a control amount corresponding to the content of the operation.

The phrase, "adjust a control amount corresponding to the content of the operation in the in-vehicle device 90", referred to herein includes a change of settings in the in-vehicle device 90. When the in-vehicle device 90 is, for example, an audio instrument, the phrase, "adjust a control amount", referred to herein includes a volume adjustment, a selection of radio stations, and a skip of a song that is now playing. When the in-vehicle device 90 is, for example, an in-vehicle air conditioner, the phase, "adjust a control amount", referred to herein includes an adjustment of an air volume and an adjustment of a temperature in the vehicle interior.

In the input acceptance processing, the control portion 75 subsequently returns the processing to S110.

Example of Use

A description will now be given to an example of use in a case where the in-vehicle device 90 is an in-vehicle air conditioner and the user adjusts, for example, a temperature in the vehicle interior by remote control using the remote operation device 1.

When the in-vehicle air conditioner is operated by remote control, the user of the remote operation device 1 first places his hand on the touch panel 18 so as to locate a relative position of the user's hand with respect to the first operation acceptance portion 22 at a covered position. The user then tilts the first operation acceptance portion 22 (rotary dial 26) in a predetermined direction with the hand placed on the touch panel 18 and determines the in-vehicle air conditioner as the in-vehicle device 90 to be controlled.

After the in-vehicle air conditioner is determined as the in-vehicle device 90 to be controlled, the user of the remote operation device 1 keeps the relative position of the user's hand with respect to the first operation acceptance portion 22 at the covered position. The user, while keeping the relative position at the covered position, tilts the first operation acceptance portion 22 (rotary dial 26) in a predetermined direction and determines an adjustment of a temperature in the vehicle interior as a controlled item in the in-vehicle air conditioner.

After an adjustment of a temperature in the vehicle interior is determined as the controlled item, the user of the remote operation device 1 relocates the relative position of the user's hand with respect to the first operation acceptance portion 22 at an uncovered position. The user subsequently rotates the second operation acceptance portion 40 (ring portion 42) to output an amount of rotation to the in-vehicle air conditioner. Upon receipt of the amount of rotation, the in-vehicle air conditioner changes a temperature of blown air according to the amount of rotation.

Effects of Embodiment

As has been described, according to the remote operation device 1, a relative position of the user's hand with respect to the first operation acceptance portion 22 (rotary dial 26) can be detected with the touch panel 18 provided to the palm rest 10 on the basis of a position and an area of the touch panel 18 where the user's hand is in contact.

In other words, according to the remote operation device 1, an input of information can be accepted and a relative position of the user's hand with respect to the first operation acceptance portion 22 can be detected via the touch panel 18 provided to the palm rest 10.

Further, according to the remote operation device 1, subjects to accept an operation (that is, subjects to accept an input) can be switched according to a relative position of the user's hand with respect to the first operation acceptance portion 22.

For example, when the user of the remote operation device 1 first selects and determines a controlled item in the in-vehicle device 90 to which a control amount the user wishes to adjust is to be inputted, the user selects the controlled item in the in-vehicle device 90 by locating a relative position of the user's hand with respect to the first operation acceptance portion 22 at a covered position. After the selection of the controlled item in the in-vehicle device 90 is completed, the user relocates the relative position of the user's hand with respect to the first operation acceptance portion 22 at an uncovered position and inputs a control amount the user wishes to adjust via the second operation acceptance portion 40.

In other words, according to the remote operation device 1, when the user inputs information via the first operation acceptance portion 22, a relative position of the user's hand with respect to the first operation acceptance portion 22 has to be at a covered position. Meanwhile, when the user inputs information via the second operation acceptance portion 40, a relative position of the user's hand with respect to the first operation acceptance portion 22 has to be at an uncovered position.

Consequently, according to the remote operation device 1, acceptances of an input of a content different from a content of an operation the user originally intended to make due to an erroneous operation can be reduced.

According to the remote operation device 1, in particular, the first operation acceptance portion 22 and the second operation acceptance portion 40 can be switched in a reliable manner as to which one is to accept an input of information by controlling the solenoid 46.

In the embodiment above, the solenoid 46 corresponds to a drive switching portion that switches drive states of the first operation acceptance portion 22 and the second operation acceptance portion 40, that is, switches the locked state to the unlocked state and vice versa.

OTHER EMBODIMENTS

While the embodiment of the present disclosure has been described, it should be appreciated that the present disclosure is not limited to the embodiment above and can be implemented in various manners within the scope of the present disclosure.

Figure 6A:
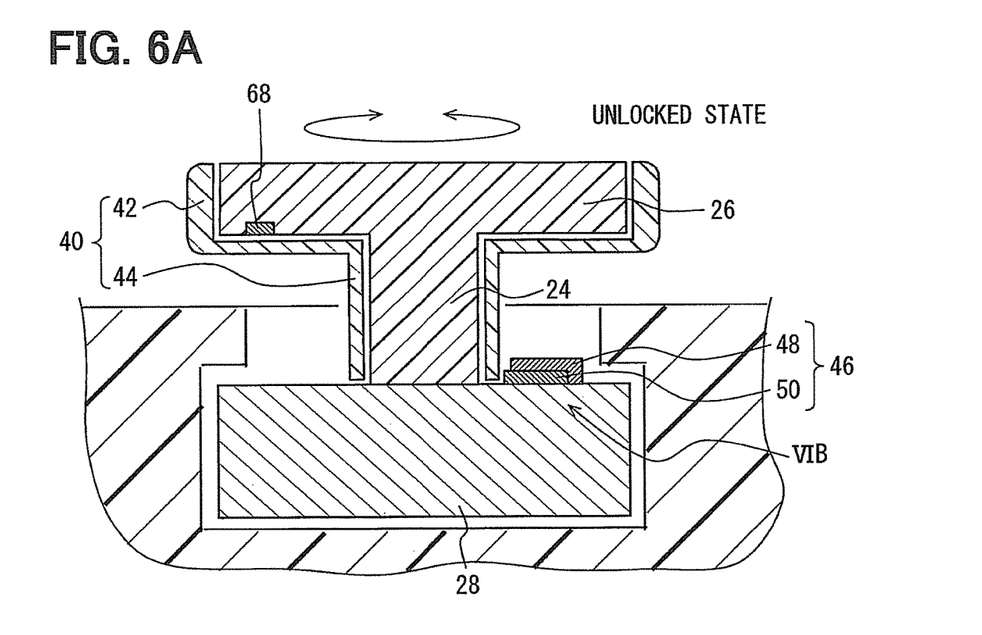
FIG. 6A is a schematic sectional view of a modification of the second operation acceptance portion of the remote operation device to show a configuration in an unlocked state.
Figure 6B:
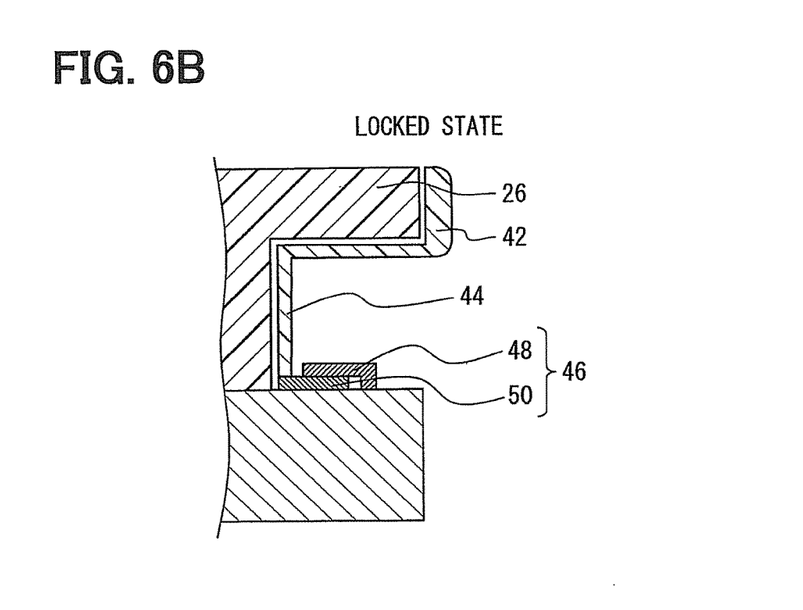
FIG. 6B is a partial sectional view in a portion VIB of the remote operation device shown in FIG. 6A to show a locked state.

For example, the solenoid 46 is disposed in an inner part of the rotary dial 26 of the first operation acceptance portion 22 in the embodiment above. However, the solenoid 46 is not necessarily disposed in the inner part. More specifically, as are shown in FIG. 6A and FIG. 6B, a solenoid 46 may be disposed at a lower part of a support shaft 24 of a first operation acceptance portion 22. In such a case, the solenoid 46 may be disposed for a movable iron core 50 to be driven inward along a radial direction of the support shaft 24.

In other words, the solenoid 46 shown in FIG. 6A and FIG. 6B switches to a locked state as the movable iron core 50 protrudes inward in the radial direction of the support shaft 24 until the movable iron core 50 engages with a shaft portion 44 of a second operation acceptance portion 40.

In the embodiment above, a relative position of the user's hand with respect to the rotary dial 26 is estimated on the basis of a position and an area of the touch panel 18 where the user's hand is in contact. However, a relative position of the user's hand with respect to the rotary dial 26 is not necessarily detected by the above method. For example, one or more than one infrared sensor may be embedded in a palm rest 10 to enable a detection of a relative position of the user's hand with respect to the rotary dial 26. Alternatively, a relative position may be detected according to an image captured by a camera disposed to be capable of capturing an image of a vehicle interior.

Further, in the embodiment above, the remote operation device 1 is installed on the console provided between the driver's seat and the front passenger's seat in the vehicle interior. However, the remote operation device 1 is not necessarily installed on the console specified above. The remote operation device 1 may be installed, for example, on a door trim of an automobile or on a console provided in back seats of an automobile.

In the embodiment above, the remote operation device 1 is installed to an automobile. However, the remote operation device 1 is not necessarily installed to an automobile. For example, the remote operation device 1 may be installed to a train, an air plane, and a marine vessel. In short, the remote operation device 1 may be installed to any type of mobile body.

While the embodiments of the present disclosure have been described, it should be appreciated that the present disclosure includes the embodiments even when a part of the configurations are omitted to the extent that the problems can be solved. The present disclosure also includes any combination of the above embodiments and modifications. The present disclosure further includes any form conceivable within the scope of the disclosure specified by the languages of the appended claims.

The flowcharts and processing in the flowcharts described herein are formed of multiple sections (or referred to as steps). Each section is referred to as, for example, S100. Each section may be divided to two or more sub-sections. Conversely, multiple sections may be combined into a single section. The respective sections formed as above may be referred to also as devices, modules, means, or portions.

What is claimed is:

1. A remote operation device attached to an attached portion, which is a predetermined portion of a mobile body, and configured to operate a device installed to the mobile body by remote control, the remote operation device comprising:

a first operation acceptance portion provided as a mechanism to accept an operation from an outside and having a rotary disc supported in a displaceable and rotatable manner and a reactive force generation mechanism applying a force to the rotary disc in response to the operation from the outside;

a second operation acceptance portion provided as a mechanism to accept an operation from the outside and provided along an outer periphery of the rotary disc of the first operation acceptance portion and allowed to rotate separately from at least the rotary disc;

a position detection portion detecting a relative position of a user's hand with respect to the first operation acceptance portion;

and a control portion controlling the first operation acceptance portion to be a subject to accept an operation when the relative position detected by the position detection portion is at a covered position at which a percentage of the first operation acceptance portion covered by the user's hand is equal to or greater than a preliminarily determined percentage, and controlling the second operation acceptance portion to be a subject to accept an operation when the relative position is at an uncovered position at which the percentage of the first operation acceptance portion covered by the user's hand is less than the predetermined percentage.

2. The remote operation device according to claim 1, further comprising:

a palm rest portion extending from the attached portion so as to cover the first operation acceptance portion and provided with a touch panel at a position corresponding to a top surface of the first operation acceptance portion, wherein the position detection portion detects the relative position of the user's hand with respect to the first operation acceptance portion on the basis of a position and an area of the touch panel where the user's hand is in contact.

3. The remote operation device according to claim 1, further comprising:

a drive switching portion that switches the second operation acceptance portion between a locked state in which the second operation acceptance portion is locked with the first operation acceptance portion so as to rotate integrally with the first operation acceptance portion and an unlocked state in which the second operation acceptance portion is released from the locked state so as to rotate separately from the first operation acceptance portion, wherein the control portion controls the drive switching portion to switch the second operation acceptance portion to the locked state when the relative position detected by the position detection portion is at the covered position, and controls the drive switching portion to switch the second operation acceptance portion to the unlocked state when the relative position is at the uncovered position.

* * * * *